United States Patent
Chen et al.

(10) Patent No.: US 9,065,623 B1
(45) Date of Patent: Jun. 23, 2015

(54) MIXED MAPPING FOR RATE COMPATIBLE TRELLIS CODED MODULATION

(75) Inventors: Zhengang Chen, San Jose, CA (US); Shashi Kiran Chilappagari, San Jose, CA (US); Xueshi Yang, Cupertino, CA (US); Gregory Burd, San Jose, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 417 days.

(21) Appl. No.: 13/249,754

(22) Filed: Sep. 30, 2011

Related U.S. Application Data

(60) Provisional application No. 61/389,658, filed on Oct. 4, 2010.

(51) Int. Cl.
*H04L 1/00* (2006.01)
*H03M 13/25* (2006.01)
*H04L 27/18* (2006.01)
*H04L 27/34* (2006.01)

(52) U.S. Cl.
CPC ............. *H04L 1/006* (2013.01); *H03M 13/256* (2013.01); *H04L 27/186* (2013.01); *H04L 27/3416* (2013.01); *H03M 13/25* (2013.01)

(58) Field of Classification Search
CPC ..... H04L 1/006; H04L 1/0013; H04L 1/0041; H04L 1/0068; H03M 13/25; H03M 13/256
USPC .......... 375/265; 714/755, 756, 780, 786, 792, 714/796
See application file for complete search history.

(56) References Cited

U.S. PATENT DOCUMENTS

| | | | |
|---|---|---|---|
| 7,292,643 B1 * | 11/2007 | Gardner | 375/265 |
| 2003/0226095 A1 * | 12/2003 | Cameron et al. | 714/792 |
| 2006/0078062 A1 * | 4/2006 | Pons et al. | 375/265 |
| 2008/0201628 A1 * | 8/2008 | Liou et al. | 714/786 |
| 2009/0217142 A1 * | 8/2009 | Cameron et al. | 714/796 |
| 2010/0017678 A1 * | 1/2010 | Pons et al. | 714/752 |

* cited by examiner

*Primary Examiner* — Daniel Washburn
*Assistant Examiner* — Eboni Hughes

(57) ABSTRACT

Systems, methods, apparatus, and techniques are provided for producing encoded trellis coded modulation (TCM) data from user information. Encoding parameters are selected based on a target information rate. The encoding parameters include a first dimensionality value and a second dimensionality value. A first part of the user information is encoded based on the first dimensionality value to produce a first number of coded bits, and a second part of the user information is encoded based on the second dimensionality value to produce a second number of coded bits.

20 Claims, 6 Drawing Sheets

MIXED MAPPING FOR RATE COMPATIBLE TRELLIS CODED MODULATION

CROSS REFERENCE TO RELATED APPLICATION

This application claims the benefit under 35 U.S.C. §119(e) of U.S. Provisional Application No. 61/389,658, filed Oct. 4, 2010, which is incorporated herein by reference in its respective entirety.

BACKGROUND

Many communications and data storage systems require an approximately constant information rate for reading, writing, or otherwise processing data. For example, multi-level cell (MLC) NAND flash memory systems typically write data at a uniform rate of two or three bits per memory cell. Further, such communications and storage systems often operate at high information rates (e.g., rates of information content to coded data symbols). For example, a typical MLC NAND flash memory application may require an information rate of at least 0.9 information bits per coded bit, wherein an information bit represents the amount of uncoded application or user content that can be represented by one bit.

Trellis Coded Modulation (TCM) combines coding and modulation to achieve high information rates with little or no signal bandwidth expansion. In a given application, a TCM scheme may be concatenated with an outer Reed-Solomon (RS) code and redundancy may advantageously be allocated between the RS code and the TCM scheme in a time-varying manner. A rate of the TCM scheme should therefore be time-adjustable in order to provide a constant system output information rate. To adjust a TCM information rate, a number of information bits in a TCM symbol may be varied, while a total number of bits in the TCM symbol is kept constant. Such a scheme typically provides a small number of adjustable TCM information rates.

SUMMARY

Described herein are techniques for producing encoded TCM data from user information. A target information rate is determined and encoding parameters are selected based on the target information rate. The encoding parameters include a first dimensionality value and a second dimensionality value, where the second dimensionality value is different from the first dimensionality value. A first part of the user information is encoded during a first TCM processing interval based on the first dimensionality value to produce a first number of coded bits, and a second part of the user information is encoded during a second TCM processing interval based on the second dimensionality value to produce a second number of coded bits.

In certain implementations of these techniques, encoding the first part of the user information includes processing the first part of the user information with a convolutional encoder. Further, in certain implementations of these techniques, the target information rate is updated after encoding a predetermined number of TCM symbols. Additionally, in certain implementations of these techniques, encoding parameters are updated responsive to an updating of the target information rate. Further, in certain implementations of these techniques, a system output rate is measured and the encoding parameters are updated responsive to a difference between the system output rate and the target information rate.

Also described herein are systems, methods, and apparatus for generating TCM data from user information. Rate control circuitry determines a target information rate for the encoded TCM data, and feedback circuitry selects encoding parameters based on the target information rate. The encoding parameters include a first dimensionality value and a second dimensionality value that is different from the first dimensionality value. Further, encoding circuitry encodes a first part of the user information during a first TCM processing interval based on the first dimensionality value to produce a first number of coded bits and encodes a second part of the user information during a second TCM processing interval based on the second dimensionality value to produce a second number of coded bits.

In certain implementations of these systems, methods, and apparatus, the encoding parameters include a dimensionality sequence and/or the encoding circuitry encodes the first part of the user information during the first TCM processing interval by processing the first part of the user information with a convolutional encoder. Additionally, in certain implementations of these systems, methods, and apparatus, the rate control circuitry updates the target information rate for the encoded TCM data after the encoding circuitry encodes a predetermined number of TCM symbols.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

To operate effectively, a TCM scheme should be able to achieve a wide range of adjustable rates at a moderate level of computational and hardware complexity. A multi-dimensional TCM (MD-TCM) scheme jointly processes multiple base constellation symbols during a single processing period. The number of base constellation symbols processed per TCM symbol is referred to as the dimensionality of the MD-TCM scheme and will be denoted by k herein. A MD-TCM scheme allows for higher effective information rates than possible with one-dimensional TCM schemes. For example, while a one-dimensional TCM scheme using 8PSK constellation permits, at best, an effective code rate of 2/3 (assuming one bit of redundancy), a three-dimensional MD-TCM using 8PSK as a base constellation permits an effective code rate of 8/9 and a four-dimensional MD-TCM scheme permits an effective code rate of 11/12 (again, assuming one bit of redundancy in each case).

In addition to obtaining higher information rates than possible with one-dimensional TCM, MD-TCM may employ mixed mapping—in which different TCM symbols have different dimensions, to support a wide variety of information rates. For example, a combination of some or all of two-dimensional, four-dimensional, and eight-dimensional TCM symbols may be used in a mixed mapping MD-TCM scheme, where the dimensionality of TCM symbols are varied according to a prescriber sequence.

A mixed-mapping MD-TCM scheme could potentially require significant computational resources at a transmitter and/or receiver. However, as described herein, a small number of dimensionalities may be combined or "mixed" in a MD-TCM system so as to support a wide variety of desired code rates without requiring undue complexity. For example, in an arrangement, TCM symbols of dimensionality two, four, and eight are multiplexed over time to create a range of possible information rates at an MD-TCM encoder. A mixed-mapping MD-TCM scheme may adjust among several possible information rates in order to maintain an overall output system information rate.

Figure 1:
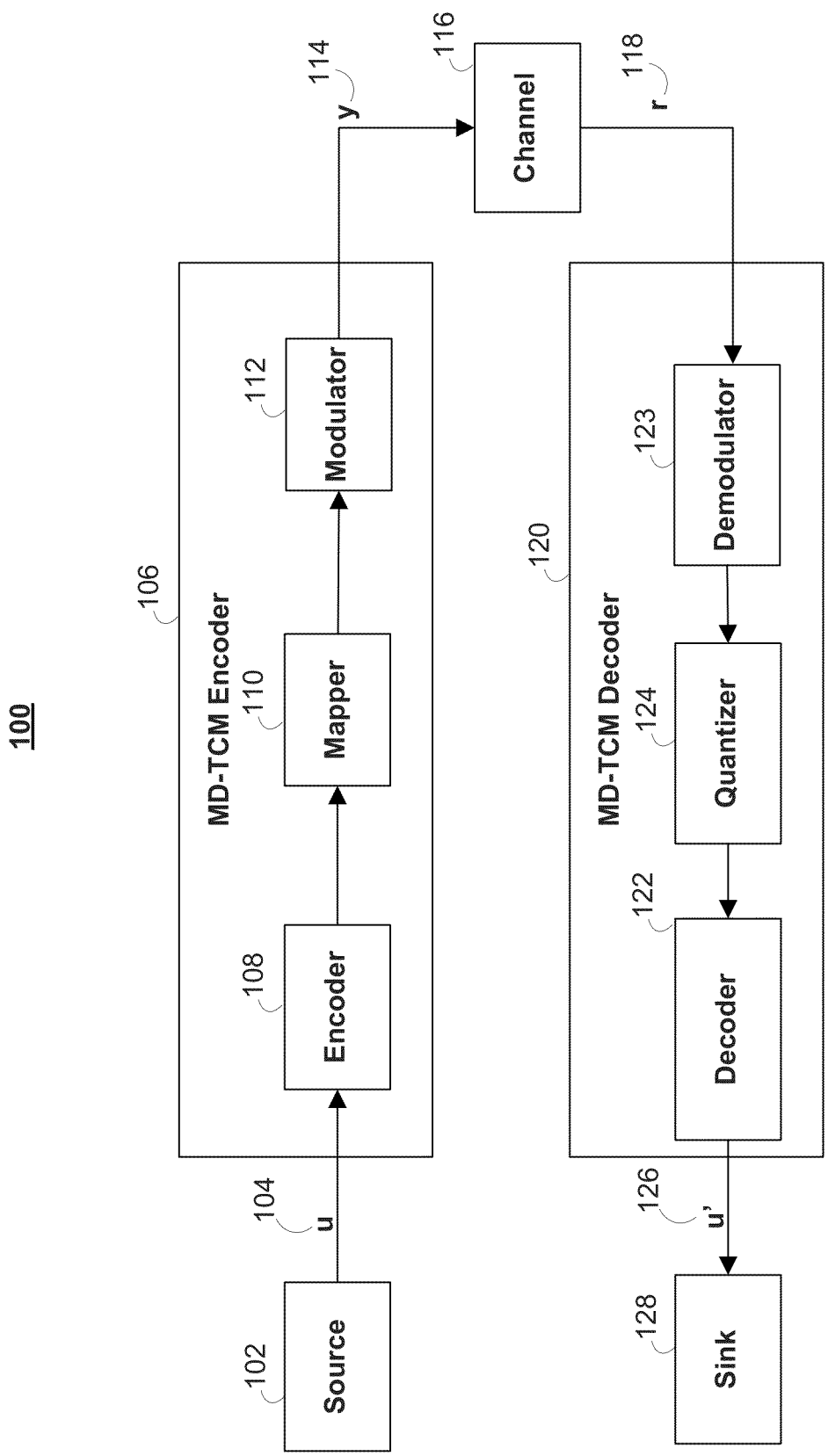
FIG. 1 shows a simplified block diagram of communications or storage system in accordance with certain implementations.

FIG. 1 shows a simplified block diagram of communications or storage system 100 in accordance with certain implementations. Communications or storage system 100 includes source 102, MD-TCM encoder 106, channel 116, MD-TCM decoder 120, and sink 128. Communications or storage system 100 may be used to transfer user information 104, which will also be denoted by the symbol u, from source 102 to sink 128. Source 102 may be any suitable source that can provide user information u 104. For example, source 102 may be, but is not limited to, a host (that makes storage requests). User information 104 provided from source 102 to sink 128 can represent any type of information such as video information, financial information, and/or voice information. Further, user information 104 may be a sampled and/or quantized version of an analog signal that is represented in a suitable digital form.

User information 104 may be transferred from source 102 to sink 128 using one or more information-carrying signals. The information-carrying signals may be transferred through a transmission or storage medium that has the effect of degrading the signals. This transmission or storage medium is represented in FIG. 1 by channel 116. Channel 116 may represent an electrical media (e.g., FLASH memory or RAM), or an optical storage media (e.g., a CD-ROM). Alternatively, channel 116 may represent any suitable wired or wireless transmission medium through which user information 104 is conveyed. The communications or storage medium may also cause the information-carrying signals to be affected by additive signal-dependent or signal-independent noise. In some implementations, the noise of channel 116 may be modeled as additive white Gaussian noise (AWGN).

MD-TCM encoder 106 may prepare user information 104 obtained from source 102 for transmission through channel 116. The resulting information-carrying signal or signal vector is referred to herein by the symbol y. MD-TCM encoder 106 includes, without limitation, encoder 108, mapper 110, and modulator 112. As will be described in more detail below, encoder 108 may be used to encode user information 104 using a convolutional code. For example, encoder 108 may encode user information 104 based on a suitable rate-1/2 or rate-2/3 convolutional code. In an arrangement, MD-TCM encoder 106 segments user information 104 into a two portions. A first portion of the user information 104 is encoded by encoder 108 (e.g., by adding one bit of redundancy to the first portion of the user information 104) before being passed to mapper 110, and a second portion of user information 104 is passed directly to mapper 110 without encoding. MD-TCM encoder 106 uses mapper 110 to map bits of information to signal constellation points. For example, mapper 110 may map inputs provided by encoder 108 into constellation points in a 4PAM, 8PAM, 16PAM, or 64PAM constellation. Other suitable modulation schemes that MD-TCM encoder 106 may use include an M-level QAM, PSK, or OFDM scheme.

As described below, mapper 110 may perform the mapping, in part, by using a coset partitioning scheme to increase the minimum squared Euclidean distance between the signal constellation points. Mapper 110 processes symbols of size m×k bits and also outputs symbols of size m×k bits. In the disclosure herein, m is an integer value that denotes the number of bits required to represent one symbol from the utilized constellation (e.g., m=2 for a four-point constellation such as QPSK, and m=4 for a 16-point constellation such as 16QAM), and k is an integer value that represents the dimension (i.e., number of symbols from the constellation) processed by MD-TCM encoder 106 during one processing interval.

At the input of mapper 110, a relatively small number of coded bits are used to indicate selection of a coset (e.g., a coset label), whereas a relatively large number of bits are uncoded. In certain arrangements, mapper 110 is implemented as a matrix multiplier. As m indicates the number of bits required to represent a single signal point in a corresponding signal constellation, m will also be referred to a representation bit-length (for the corresponding signal constellation) in this disclosure. For example, in an implementation, MD-TCM encoder 106 uses 8PSK and has a dimension of k=5. In this case, each symbol processed by MD-TCM encoder 106 consists of $\log_2(8) \times 5 = 15$ bits, where $\log_2(8) = 3$ is the number of bits required to represent one 8PSK constellation point. The multiple dimensions of a TCM symbol may implemented spatially (e.g., for MIMO systems), in the frequency domain (e.g., orthogonal carrier frequencies), in time (e.g., sequentially), or using a combination of these and other basis. As will, be described further below, MD-TCM encoder 106 may vary the dimension k between consecutive TCM symbols in order to achieve different information rates at different times.

MD-TCM encoder 106 includes modulator 112 for modulating coded information data output from mapper 110. Modulator 112 may convert data output from mapper 110 to signal vector 114. Signal vector 114 will also be denoted by the symbol, y.

The encoding, mapping, and modulation techniques implemented by MD-TCM encoder 106 may be designed to operate effectively together. This design approach is typically referred to as coded modulation, which is a type of bandwidth efficient communication. That is, coded modulation may not require much bandwidth expansion to maintain the same throughput as transferring encoded user information, even though redundancy is added to the information stream. In some implementations, MD-TCM encoder 106 may integrate the functions of encoding, mapping, and/or modulating into a single hardware component.

With continuing reference to FIG. 1, because of the effects of channel 116, signal or signal vector 118 received by MD-TCM decoder 120 (which will also be denoted by the symbol, r) may be a distorted or noisy version of signal or signal vector 114. MD-TCM decoder 120 can interpret signal vector 118 and can attempt to recover user information 104 from signal vector 118. To obtain an estimate 126 of user information 104 (estimate 126 will also denoted by the symbol, u'), MD-TCM decoder 120 may include demodulator 123, quantizer 124 and convolutional decoder 122. Demodulator 123 demodulates signal vector 118. For example, demodulator may convert signal vector 118 from a modulated carrier frequency into a baseband signal suitable for processing by other components of MD-TCM decoder 120.

Convolutional decoder 122 may be matched to decoder 122. For example, if encoder 108 is a rate-1/2 convolutional code encoder, decoder 122 may be a Viterbi-based decoder matched to the rate-1/2 convolutional code. In some implementations, decoder 122 and quantizer 124 may be combined into a single hardware component.

As described above, MD-TCM encoder 106 employs coset partitioning. Coset partitioning refers to a technique that separates the constellation points or signal point vectors in a modulation scheme (e.g., the eight constellation points in 8PAM) into separate groups referred to as cosets. For an 8PAM scheme, for example, MD-TCM encoder 106 and MD-TCM decoder 120 may operate based on four cosets that each includes two signal points. To encode user information 104, MD-TCM encoder 106 may first determine a coset that will be used to transmit user information 104 and may then select signal points from within the selected coset for the transmission. Similarly, to decode received signal vector 118, MD-TCM decoder 120 may first identify a coset to which the information contained within received signal vector 118 belongs, and then may provide an estimate based on a signal point or signal point vector in the identified coset.

Figure 2:
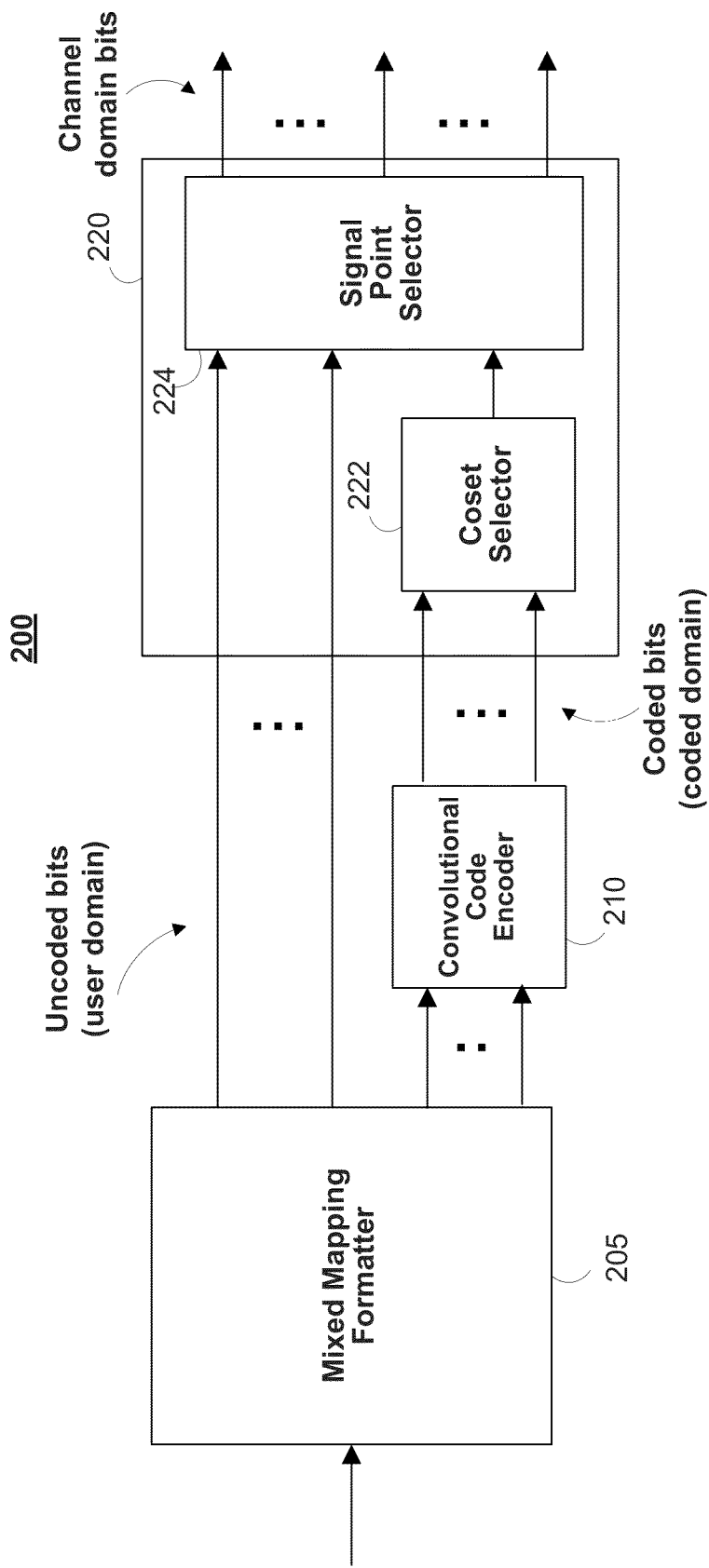
FIG. 2 shows a simplified block diagram of a mixed mapping MD-TCM encoder that operates according to coset partitioning in accordance with certain implementations.

FIG. 2 shows a simplified block diagram of mixed mapping MD-TCM encoder 200 that operates according to coset partitioning in accordance with certain implementations. MD-TCM encoder 200 may be a more detailed implementation of encoder 108 and mapper 110 of MD-TCM encoder 106 in FIG. 1. MD-TCM encoder 200 receives L user bits and converts the L user bits into a TCM symbol of size m×k bits, where again k is the dimension of the TCM symbol. In certain implementations, the group of L user bits is first split into first and second groups of $cc_k$ and $L-cc_k$ bits, respectively. The $cc_k$ bits of the first group are provided as input to rate-$cc_k/cc_n$ convolutional code encoder 210 to product a $cc_n$ length output. The $cc_n$ length output of encoder 210 is called coset label while the $L-cc_k$ bits of the second group are used to determine multi-dimensional signal constellation points from within the selected coset. The total of $L-cc_k+cc_n$ bits are arranged into an m×k matrix and mapped to a channel domain representation matrix which represents the modulated signal.

From the above description, it follows that $m\times k=(L-cc_k)+cc_n$. For clarity of explanation, it will be assumed that $cc_n=cc_k+1$ in portions of this disclosure. However, it would be clear to one of ordinary skill in the art, based on the teachings of this disclosure, that $cc_n$ may differ from $cc_k$ by any suitable integer amount. For example, in other implementations, it would be valid to set $cc_n=cc_k+2$, $cc_n=cc_k+5$, and $cc_n=cc_k+10$. The rate of the MD-TCM scheme when $cc_n=cc_k+1$ is given by Rate=Number of User Bits/(Number of User Bits+
Number of Parity Bits)=$L/(L+(cc_n-cc_k))$.

MD-TCM encoder 200 includes mixed mapping formatter 205. Mixed mapping formatter 205 receives or otherwise determines a target system output information rate, and adjusts the parameters of MD-TCM encoder 200 accordingly to attain the target rate, e.g., based on a measured input information rate from an outer RS encoder. MD-TCM encoder 200 may adjust parameters once every TCM symbol, periodically once every P symbols, or according to any other deterministic or adaptive update schedule.

For example, mixed mapping formatter 205 may specify a dimension k to be used by MD-TCM encoder 200 for the current TCM symbol, a rate of convolutional code encoder 210, whether conventional code encoder 210 uses puncturing and shortening schemes and, if so, relevant parameters of these schemes, and/or a signal constellation to be used by MD-TCM encoder 200 (e.g., 8PSK). Some or all of these parameters may be provided as inputs to mixed mapping formatter 205 or mixed mapping formatter 205 may determine this parameter using, e.g., internal calculations based on stored information.

MD-TCM encoder 200 includes signal mapper 220, which itself includes coset selector 222 and signal point selector 224. In certain implementations, signal mapper 220 partitions the multi-dimensional constellation space in the channel domain into a number of cosets. In these implementations, signal mapper 220 maps input bits (e.g., m×k bits per symbol) into output symbols all belonging to the same coset label. That is, convolutionally coded bits are mapped in constellation points in the same coset. Mixed mapping formatter 205 outputs a number of uncoded user information bits, which may sometimes be referred to as bits in a user domain. A subset of the uncoded bits may be encoded by convolutional code encoder 210, which may encode this subset based on any suitable, and possibly time-varying, convolutional code rate (e.g., rate-1/2, rate-2/3, and/or rate-3/5). In certain implementations, convolutional code encoder 210 may be configured to encode two uncoded user data bits, u(0) and u(1), into a three-bit output. In this case, $cc_k=2$ and $cc_n=3$.

The output bits of convolutional code encoder 210 are provided as inputs to coset selector 222. Coset selector 222 identifies a coset based on the encoded bits obtained from convolutional code encoder 210. The greater the number of coded bits provided to coset selector 222, the greater the number of cosets the coset selector 222 can select from (hence, the greater number of cosets a given signal constellation can be divided into). A total of $(L-cc_k)+cc_n$ bits, i.e., the $cc_n$ bits provided by coset selector 222 and the $(L-cc_l)$ bits provided directly from mixed mapping formatter 205 are provided to signal point selector 224. Using the coset selected by coset selector 222, signal point selector 224 may identify a signal point or signal point vector from within the coset. Thus, similarly, the greater the number of uncoded bits (i.e., bits that are not encoded by convolutional code encoder 210), the greater the number of signal points there may be in each coset.

Signal point selector 224 provides vector outputs that may be referred to as being in a channel domain. Signal point selector 224 may provide k vector outputs corresponding to the number of dimensions specified by mixed mapping formatter 205. Each vector output corresponds to a different base signal constellation point from the selected coset. For example, each vector output may be a three-bit output (i.e., m=3) from a selected coset of an 8PAM signal. In certain implementations, coset selector 222 and/or signal point selector 224, via signal mapper 220, are implemented using a matrix multiplier. In these implementations, input bits (e.g., m×k input bits) may be multiplied by a k×k mapping matrix, and the output would then be a m×k matrix in channel domain.

Figure 3:
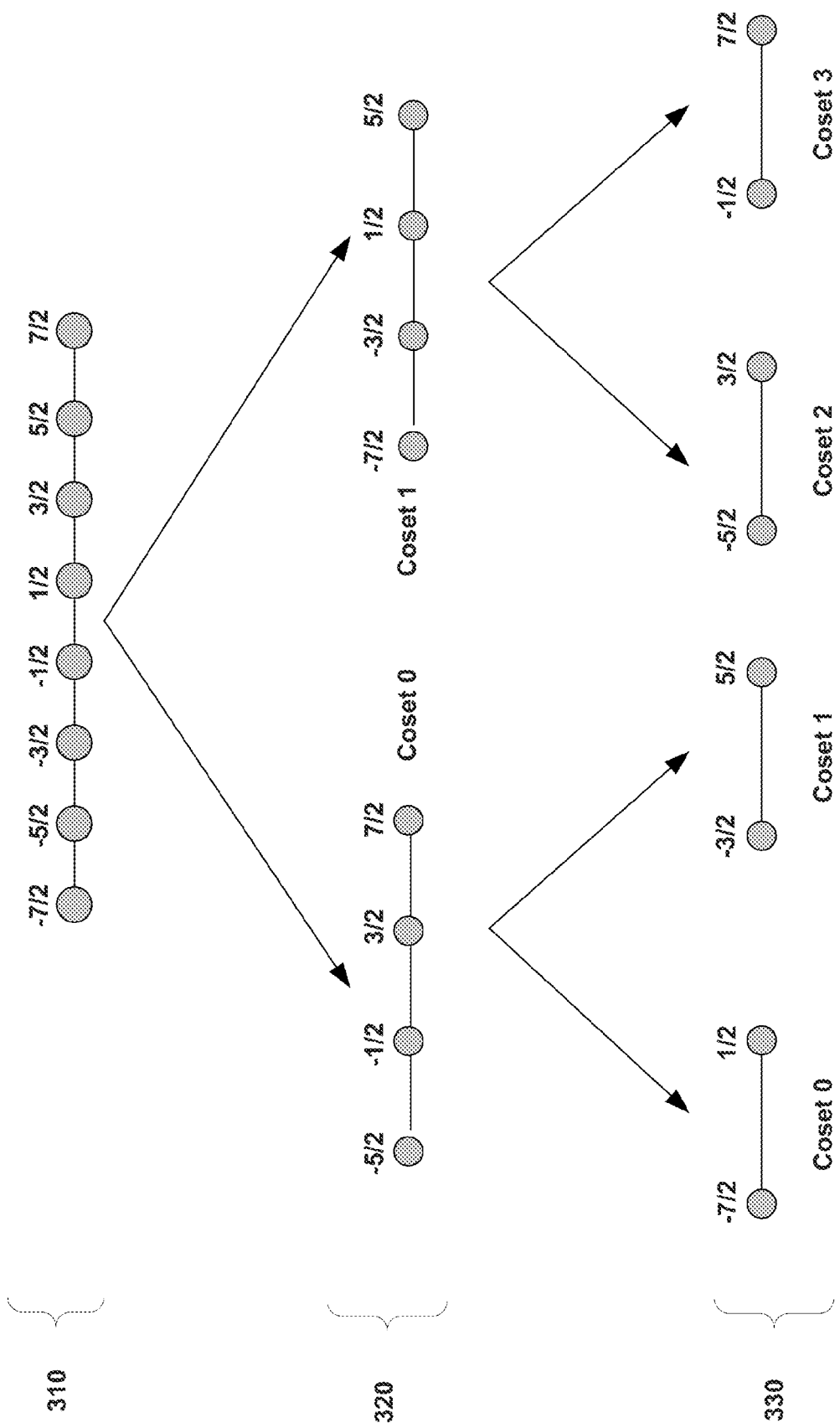
FIG. 3 shows an illustrative example of coset partitioning that may be performed by a MD-TCM encoder for an 8PAM signal constellation in accordance with certain implementations.

FIG. 3 shows an illustrative example of coset partitioning that may be performed by MD-TCM encoder 200 for an 8PAM signal constellation in accordance with certain implementations. The symbols from this constellation may be mapped onto points in a Euclidean space thereby providing a distance metric among the signal points of the constellation. For example, the mapping for the eight signal points of the 8PAM signal constellation is shown by constellation 310 of FIG. 3, where the labels −7/2, −5/2, −3/2, etc. denote normalized signal energy values. It can be seen that the minimum squared Euclidean Distance (SED) between two points in constellation 310 is 1 (e.g., $\|5/2-3/2\|^2=1$).

The minimum SED between any two points can be advantageously increased by coset partitioning. For example, signal mapper 220 may use a coset partitioning scheme as shown in partition 320 of FIG. 3. In this coset partitioning scheme, constellation 310 has been segmented into two cosets and the minimum SED between two points in either coset is equal to 4 (e.g., $\|7/2-3/2\|^2=4$). As another example, signal mapper 220 may use a coset partitioning scheme as shown in partition 330 of FIG. 3. In this scheme, constellation 310 has been segmented into four cosets, and the minimum SED between two points in any of the four cosets is equal to 16 (e.g., $\|7/2-(-1/2)\|^2=16$). In general, for a fixed dimension k, there exists a minimum required number of cosets, denoted by $N_c$, that is required to maintain a minimum SED of 4. The parameter $N_c$ will also be referred to as the coset number in the present disclosure. The minimum required value of $N_c$ for values of k between 1 and 8 with PAM-based constellations, and for a minimum SED of 4, is summarized in the table below:

TABLE 1

$N_c$ for k between 1 and 8, and a minimum SED of 4.

| Dimension k | $N_c$ for min. SED = 4 |
|---|---|
| 1 | 2 |
| 2 | 4 |
| 3 | 8 |
| 4 | 8 |
| 5 | 16 |
| 6 | 16 |
| 7 | 16 |
| 8 | 16 |

For clarity of presentation only, the minimum required value of $N_c$ for dimensions greater than k=8 are not explicitly disclosed herein, although it would be obvious to one of ordinary skill in the art, based on this disclosure, that such values of $N_c$ can similarly be derived for values of k greater than 8.

In certain implementations, mixed mapping formatter 205 specifies an operational value of $N_c$. Accordingly, signal mapper 220 identifies each of these $N_c$ cosets by a unique coset label. In particular, the coset label is specified uniquely by $cc_n=\log_2(N_c)$ bits. Hence, it follows from Table 1 that the minimum values of $cc_n$ are $cc_n=1$ for k=1, $cc_n=2$ for k=2, $cc_n=3$ for k=3 and 4, and $cc_n=4$ for k=5, 6, 7, and 8. As described previously, MD-TCM encoder 106 produces an m×k matrix referred to as a channel domain representation matrix of a TCM symbol.

Figure 4:
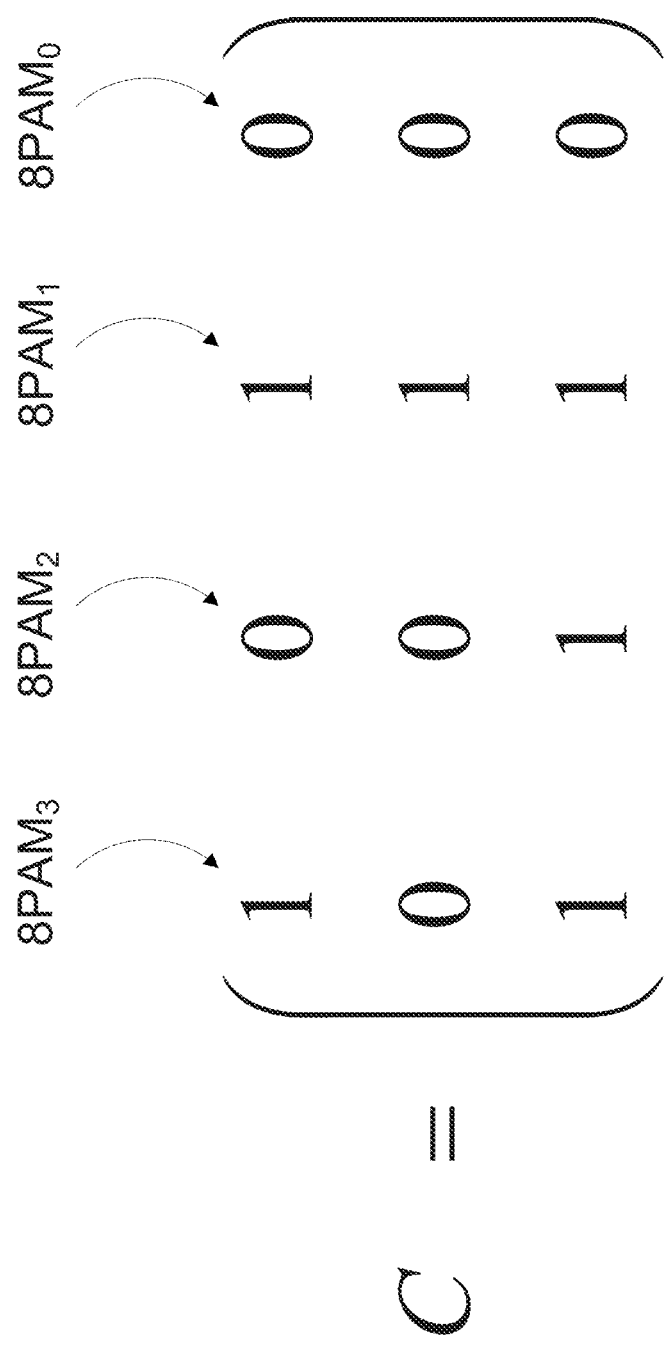
FIG. 4 shows an illustrative example of a channel domain representation matrix C produced by a MD-TCM encoder in accordance with certain implementations.

FIG. 4 shows an illustrative example of a channel domain representation matrix C produced by MD-TCM encoder 106 in accordance with certain implementations. Channel domain representation matrix 400 illustrates a case where MD-TCM encoder 106 employs a signal constellation having eight points, such as 8PAM, k=4 dimensions, and $N_c$=8 cosets. Channel domain representation matrix 400 includes outputs $8PAM_0$, $8PAM_1$, $8PAM_2$, and $8PAM_3$ which represent a consecutive sequence of four 8PAM symbols to be transmitted by communications or storage system 100.

Assuming that encoder 210 employs a rate-2/3 code, the coded coset label is $cc_n$=3 bits long. The $cc_n$ coded coset label bits may not be explicitly seen in the channel domain matrix 400, because the coset label is in user domain and the mapper 220 may not be systematic. Similarly, the L−$cc_k$ uncoded bits in user domain may not be explicitly seen in the channel domain matrix due to signal mapper 220. On the decoder side, a reverse mapper may be used to identify the coset label of a received channel domain matrix 400.

As described above, mixed mapping formatter 205 may adjust transmission parameters (e.g., the dimensionality k) at certain times (e.g., on a symbol-to-symbol basis) in order to achieve a desired information rate from MD-TCM encoder 200. To illustrate aspects of how this adjustment works in certain implementations, it will be assumed for simplicity that $cc_n=cc_k+1$ so that the information rate of MD-TCM encoder 200 is given by $$\text{Rate}=L/(L+1)=(m\times k-1)/(m\times k).$$

For a fixed base constellation (i.e., a fixed value m), mixed mapped module 205 can achieve different information rates by varying k. The different information rates that may be achieved are summarized, in part, according to the following table:

TABLE 2

MD-TCM information rates for fixed values of m.

| Dimensionality k | m = 2 | m = 3 |
|---|---|---|
| 1 | 1/2 | 2/3 |
| 2 | 3/4 | 5/6 |
| 3 | 5/6 | 8/9 |
| 4 | 7/8 | 11/12 |
| 5 | 9/10 | 14/15 |
| 6 | 11/12 | 17/18 |
| 7 | 13/14 | 20/21 |
| 8 | 15/16 | 23/24 |

To decode the signal produced by MD-TCM encoder 200, a MD-TCM decoder (e.g., MD-TCM decoder 120 of FIG. 1) uses the Viterbi algorithm to first decode the coded bits and determine the coset label. The branch metrics for the Viterbi decoder are calculated using a measure of Euclidean distance. The uncoded bits are then found by intra-coset decoding. For example, for each point r in $R^k$ (i.e., the k-dimensional Real space) a corresponding signal point in the coset closet to r (and its corresponding distance to r) can be computed. The distance may be referred to as the branch metric of the coset and the label of the multi-dimensional constellation point in the coset may be referred to as the intra-coset decision. Given a point r and a partition with $N_c$ cosets, there is one branch metric and one intra-coset decision per coset. To find these branch metrics and intra-coset decisions, $2^{mk}$ points in the possible k-dimensional signal space may be considered and a corresponding Euclidean distance and coset label may be computed. However implementation of the MD-TCM decoder (e.g., MD-TCM decoder 120) can be simplified by determining the two nearest neighbors of r in each dimension. Thus, only to $2^k$ points, rather than $2^{mk}$ points need to be searched. Further, these $2^k$ points consist of the nearest point in each coset and hence are sufficient to compute the branch metrics as well as the intra-coset decisions while requiring less computational complexity than an exhaustive search.

By way of illustration and not limitation, some examples of mixed-mapping MD-TCM schemes follow. These schemes may be implemented by communications or storage system 100 using MD-TCM encoder 106 and, more particularly, MD-TCM encoder 200.

The notation [x y] may be used to represent a mixed mapping MD-TCM scheme that alternates between dimension x and y symbols. For example, consider an [8 4] mixed mapping scheme over 8PAM. In such a scheme a first part of user information 104 is encoded during a first processing interval based on the dimensionality 8 to produce 8×m encoded bits. Similarly, a second part of the user information 104 is encoded during a second processing interval based on the dimensionality 4 to produce 4×m encoded bits.

According to Table 1, with 8PAM-based constellation, 16 cosets (i.e., $N_c$=16) are sufficient to achieve a minimum SED of 4. It follows that $cc_{n=cc_k}$+1=4. Thus, convolutional code encoder 210 may operate as a rate-3/4 encoder. When operating in k=4 mode, there are 12 total bits per TCM symbol, of which 11 are user information bits. Similarly, when operating in k=8 mode, there are 24 total bit per TCM symbol, of which 23 are user information bits. The overall information rate produced by this system, assuming operation 50-percent of the time in each of the two modes, is therefore given by Rate=(11+23)/(12+24)=17/18.

Further, other information rates may be achieved by using other values of k or simply by interleaving the existing values of k=4 and k=8 modes in other sequences.

In the above example, a rate-3/4 convolutional encoder was used. However, in the absence of any compensatory strategy, a rate-3/4 encoder can multiplex between symbols of dimensions 4, 5, 6, 7 or 8. This is because, if a smaller dimension TCM symbol is used, a lower rate convolutional code, e.g., rate-2/3, can be used to achieve minimum SED 4, with better convolutional code decoding performance at the same rate. On the other hand, if a larger TCM dimension k is used, 16 cosets will not be large enough to achieve SED of 4 (see Table 1). From these observations, it follows that a system configured with the parameters as described above can achieve information rates within the range [11/12, 23/24].

As another example, a mixed mapping MD-TCM scheme that alternates between TCM symbols of three dimensions in a round-robin fashion may be denoted by [x y z], where x, y, and z denote the three dimensions. The dimensions x, y, and z need not all be different. For example, consider the mixed mapping MD-TCM scheme denoted by [4 3 3]. From Table 1, it follows that $N_c$=8 cosets are sufficient to achieve a minimum SED of 4. Thus, convolutional code encoder 210 may use a rate-2/3 convolutional code. This results in an information rate of 9/10. It can be shown more generally that mixed mapping MD-TCM schemes involving a rate-2/3 convolutional code can achieve rates between [8/9, 11/12].

As a matter of notation, sequences of the form [x y] and [x y z] will be referred to as dimensionality sequences in the present disclosure. A dimensionality sequence specifies now the dimensionality of a consecutive sequence of TCM symbols varies within a period of transmission. As would be understood by one of ordinary skill in the art based on the present disclosure, dimensionality sequences are not limited to t forms [x y] and [x y z]. Longer or shorter dimensionality sequences are also possible. For example, the dimensionality sequence [2 4 6 2 9] denotes a mixed mapping MD-TCM scheme that alternates between TCM symbols of two, four, six, two, and nine dimensions periodically and in a round-robin fashion.

Additional information rates may be achieved by a mixed mapping MD-TCM scheme by puncturing as explained below. Consider the case that convolutional code encoder 210 implements a rate-2/3 convolutional code. Two bits are provided as input to convolutional code encoder 210 as each symbol instant and three bits are produced as output. In a systematic convolutional code, the first two output bits are equal to the two input bits and known as information bits. The third output bit is known as a parity bit. Encoder 210 may operate in a punctured mode by not transmitting some of the output bits. For example, if encoder 210 implements a systematic code, puncturing may be achieved by not transmitting some of the parity bits across different TCM symbol transmissions.

The bits to be punctured may be specified by a puncture matrix. For example, consider a puncture matrix [1 1 1; 1 1 1; 1 0 1] for a rate-2/3 convolutional code. The puncture matrix may be interpreted as follows. At symbol intervals 0 and 2, the parity bit produced by encoder 250 is transmitted, while at symbol time 1, parity bit is punctured (i.e., not transmitted). This pattern repeats itself every three TCM symbol transmissions, and this scheme is therefore an example of periodic puncturing. Focusing on encoder 250, the pattern specified by the puncturing matrix results in a total of eight output bits for six user bits (rather than a total of nine output bits for six input bits as would be the case if no puncturing was performed by encoder 210) which resulting in an information rate of 6/8=3/4. Thus, the puncturing technique can be used to effectively operate encoder 210 as a rate-3/4 convolutional encoder even through, in this example, encoder 210 is actually a rate-2/3 encoder.

Now suppose that the above puncturing scheme is employed within a mixed mapping MD-TCM system such as specified by communications or storage system 100 with MD-TCM encoder 200. Consider mixed mapping with TCM symbols of dimensions k=2 and 3 with dimensionality sequence [3 2 3] and base constellation of 8PAM. At symbol interval 0, there are three output bits from convolutional code encoder 210 (which does not puncture output at time instant 0) and eight cosets are used (i.e., $N_c$=8). At time interval 1, there are only two output bits from encoder 210 (which does puncture output at time interval 1) and four cosets are used (i.e., $N_c$=4). At time instant 2, there are again three output bits and so, again, eight cosets are used. Thus, in a given three symbol period of this TCM scheme, there are 8+6+8=22 user bits out of 9+6+9=24 total bits. Thus, the information rate of this scheme is 22/24=11/12. Note that an information rate of 14/15 could be achieved if 4-dimensional symbols (i.e., k=4) were used at time instants 0 and 2. However, without puncturing, rates only up to 11/12 could be achieved. As another example, a rate-3/4 convolutional encoder could be employed by encoder 210 with TCM symbols of dimensions 3, 4, 5, 6, 7, and 8 to achieve information rates beyond 23/24. The above examples illustrate that mixed mapping within a MD-TCM scheme facilitates puncturing. Further, experiments show that puncturing in the MD-TCM context does not result in significant increases to the decoding error rate.

Figure 5:
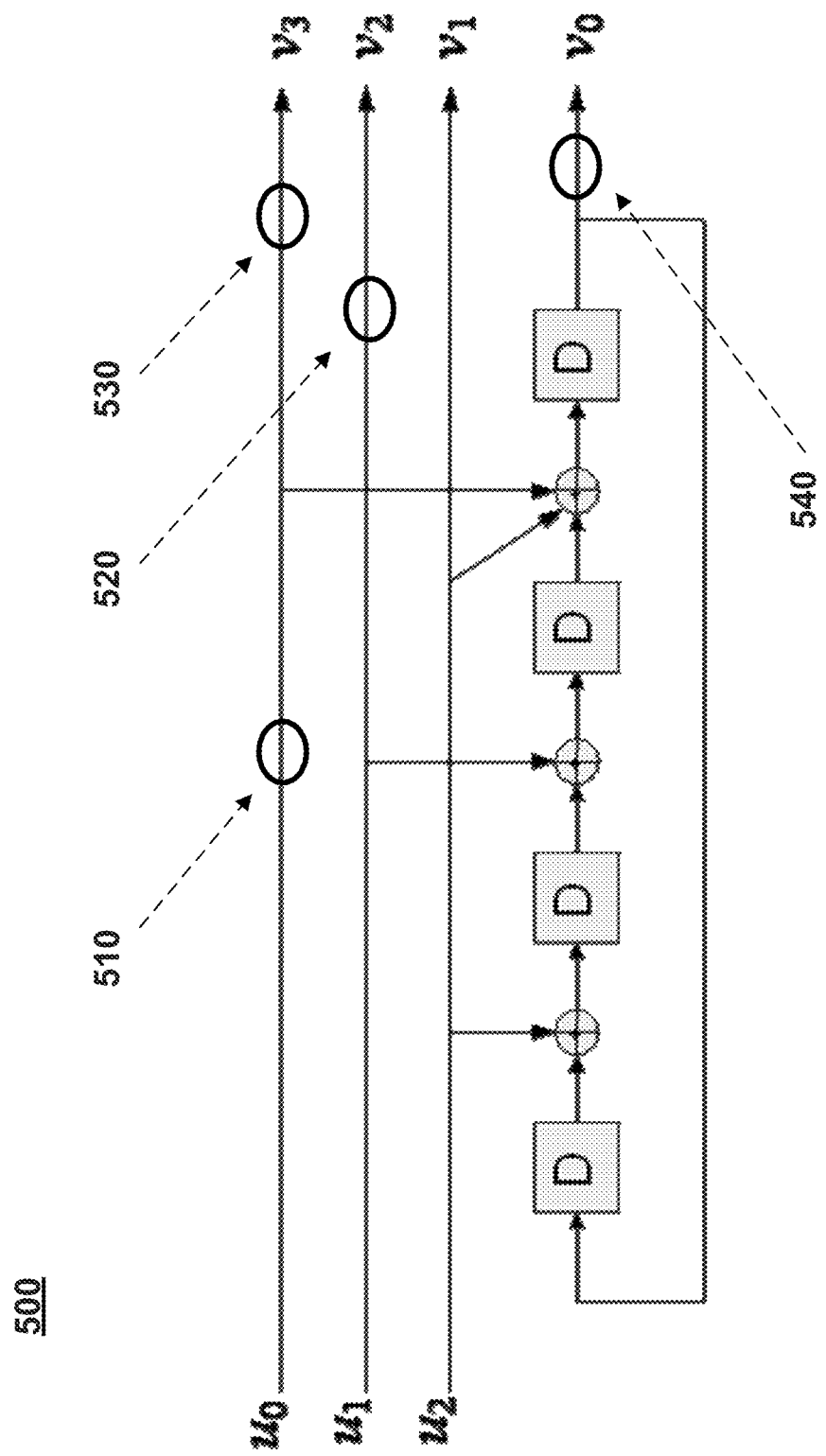
FIG. 5 shows a simplified architecture of a convolutional code encoder utilized by a MD-TCM encoder for a rate-3/4 convolutional code in accordance with certain implementations.

FIG. 5 shows a simplified architecture of encoder 210 utilized by MD-TCM encoder 200 for a rate-3/4 convolutional code in accordance with certain implementations. Convolutional encoder 500 nominally includes three bits as input (denoted by $u_0$, $u_1$, and $u_2$, respectively) and produces four bits of output (denoted by $v_0$, $v_1$, $v_2$, and $v_3$, respectively). Under one puncturing scheme, the parity bit output $v_0$ is suppressed, i.e., by suppressing the output of line 540. In one implementation, the output of line 540 is suppressed once every three TCM symbols.

As described above, MD-TCM encoder 200 adapts transmission parameters via mixed mapping formatter 205 according to, e.g., a desired system output information rate. It is desirable to implement MD-TCM encoder 200 using a single convolutional code encoder (i.e., encoder 210) that is capable of operating in multiple rate modes. One way to implement multiple rates in encoder 250 is through the technique of shortening. Shortening refers to a technique of decreasing the rate of a convolutional encoder by setting some user bits to a fixed value (usually the value 0). For example, convolutional encoder 500, which is nominally a rate-3/4 encoder, can be made to operate as a rate-2/3 encoder by setting the output of line 510 to the value 0. Similarly, convolutional encoder 500 can be made to operate as a rate-1/2 encoder by setting the output of lines 520 and 530 to the value 0.

Although puncturing and shortening have been discussed separately above, it would be clear to one of ordinary skill in the art, based on the disclosure and teachings herein, that some or all of these techniques could be combined by an MD-TCM encoder. Doing so, would advantageously allow a wide range of information rates to be achieved.

To decode the above-described shortened and puncture codes, a basic Viterbi decoder for a basic rate-3/4 convolutional encoder may be used with modifications to the branch metric assignments. In particular, the basic code has a radix-8 trellis, and each branch has a label of four bits, which can be denoted by $[e_3, e_2, e_1, e_0]$. Without shortening, there are a total $2^4=16$ unique branch metrics to be assigned for each received symbol. On the other hand, if the received convolutional code symbol is shortened, the available number of branch metrics calculated from the received symbol is less than 16 because the coded symbol only has either two bits (denoted $[v_1 \, v_0]$) or three bits (denoted $[v_2 \, v_1 \, v_0]$).

Without loss of generality, let the convolutionally coded symbol have two bits. In this case, there are 4 branch metrics computed from the received symbol with labels denoted $[e_1 \, e_0]$. These four branch metrics can be assigned to the traditional (i.e., non-shortened) 16 branch labels using the following procedures: (i) for each combination of $[e_1 \, e_0]$ add two leading zero-valued bits of padding, i.e. so form $[0 \, 0 \, e_1 \, e_0]$, (ii) assign the true branch metric for $[e_1 \, e_0]$ as the branch metric of $[0 \, 0 \, e_1 \, e_0]$, (iii) assign an "infinite" branch metric to the remaining branch labels in the basic code trellis.

Similarly, if the received convolutionally coded symbol is punctured, then the received convolutional code symbol has 3 bits $[v_3 \, v_2 \, v_1]$ since bit $v_0$ is punctured and therefore not transmitted. Eight branch metrics are generated corresponding to labels $[e_3 \, e_2 \, e_1]$. These eight branch metrics are then assigned to 16 branch labels in the basic code trellis by, for each combination of $[e_3 \, e_2 \, e_1]$, assigning a branch computed from the received coded symbol as the branch metric of both $[e_3 \, e_2 \, e_1 \, 0]$ and $[e_3 \, e_2 \, e_1 \, 1]$ in the basic code trellis. Standard Viterbi decoding can then be performed.

Figure 6:
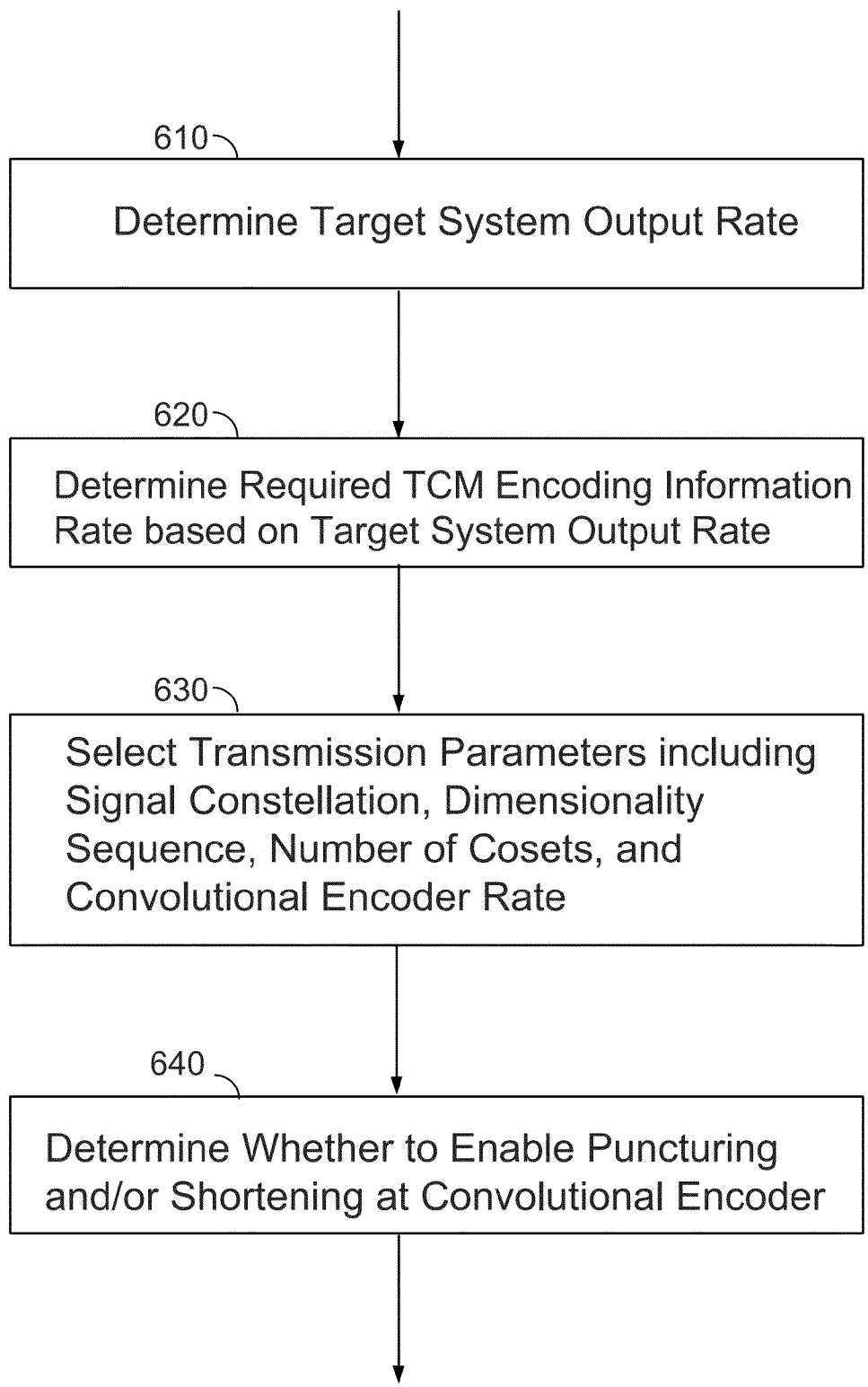
FIG. 6 shows an illustrative flowchart depicting an adaptive multi-dimensional mixed mapping protocol employed by a MD-TCM encoder in accordance with certain implementations.

FIG. 6 shows an illustrative flowchart depicting an adaptive multi-dimensional mixed mapping protocol employed by MD-TCM encoder 200 in accordance with certain implementations. Process 600 may be implemented at mixed mapping formatter 205.

At 610, a target system output rate is determined. The target system output rate may be input to mixed mapping formatter 205, retrieved from storage by mixed mapping formatter 205, or otherwise obtained. At 620, process 600 determines a required TCM encoding information rate based, at least in part, on the target system output rate. The required TCM encoding rate will also be referred to as a target information rate in this disclosure. The required TCM encoding information rate may also be determined based on an input information rate, e.g., from an outer encoder.

At 630, mixed mapping formatter 205 selects TCM transmission parameters according to the required TCM encoding information rate determined at 620. One or more of a signal constellation, dimensionality sequence, number of cosets, and convolutional encoder rate may be determined at 630. For example, an M-level signal constellation such as PAM, QAM, PSK, or OFDM along with the value of M may be selected at 630. Further, a [x y] or [x y z] dimensionality sequence may be selected at 630. Further, a number of cosets, i.e., $N_c$, may be selected for each dimension according to, e.g., Table 1. The parameters of the convolution encoder 250, i.e., $cc_k$ and $cc_n$ may be determined at 630. The TCM transmission parameters will also be referred to as encoding parameters in this disclosure.

At 640, a decision may be made as to whether puncturing and/or shortening techniques are applied at encoder 250. For example, process 600 may determine that puncturing and/or shortening should be applied if doing so is necessary to attain the target system output rate at 610.

Process 600 may be executed by mixed mapping formatter 250 according to a predefined or adaptively determined schedule. For example, protocol 600 may be executed by mixed mapping formatter 205 periodically once every 5, 10, or 100 TCM symbols, or may be executed in real-time response to a deviation in an information rate produced by an outer Reed-Solomon decoder. In certain implementations, an actual system output rate is occasionally measured (or otherwise estimated) and the target information rate is updated based on the measurement (or estimate). Further, in certain implementations, values of some or all of the encoding parameters are updated based on the updated target information rate. In certain implementations, the actual system output rate is measured or otherwise estimated and the encoding parameters are updated based on the measured or estimated system output rate.

The foregoing discloses techniques for enabling a wide range of information rates in a MD-TCM system, where different codes are achieved in part by using a time-varying mixed mapping of a set of multi-dimensional TCM transmission modes. In some implementations, a relatively small number of modes are used (e.g., three modes) and some or all of these modes may transmit TCM symbols with a different dimensionality. Even when a small number of modes are used, a large number of rates may nevertheless be produced. Further disclosed herein are techniques for implementing a mixed mapping in multi-dimensional TCM using puncturing and/or shortening techniques. One particular application for the disclosed techniques is a flash memory storage device or system employing rate compatible TCM as the error correction coding scheme. In this system, rate compatibility with the storage device or system may be achieved using the disclosed mixed mapping techniques.

The above described implementations are presented for the purposes of illustration and not of limitation. One or more parts of techniques described above may be performed in a different order (or concurrently) and still achieve desirable results. In addition, techniques of the disclosure may be implemented in hardware, such as on an application specific integrated circuit (ASIC) or on a field-programmable gate array (FPGA). The techniques of the disclosure may also be implemented in software.

What is claimed is:

1. A method for producing encoded trellis coded modulation (TCM) data from user information, the method comprising:

determining a target information rate for the encoded TCM data;

selecting one or more encoding parameters based on the determined target information rate, the one or more encoding parameters comprising a first dimensionality value for use during a first TCM processing interval and a second dimensionality value for use during a second TCM processing interval that occurs after the first TCM processing interval, wherein the first dimensionality value is different from the second dimensionality value;

encoding a first number x1 of bits in a first portion of user information during the first TCM processing interval based, at least in part, on the first dimensionality value to produce a first number y1 of coded bits at a first rate x1/y1;

encoding a second number x2 of bits in a second portion of the user information during the second TCM processing interval based, at least in part, on the second dimensionality value to produce a second number y2 of coded bits at a second rate x2/y2; and producing the encoded TCM data at a system output rate that is based on (x1+x2)/(y1+y2), wherein the system output rate is substantially equal to the target information rate.

2. The method of claim 1, wherein the first number of coded bits is equal to the first dimensionality value times a representation bit-length of a signal constellation, and wherein the second number of coded bits is equal to the second dimensionality value times the representation bit-length of the signal constellation.

3. The method of claim 1, wherein the one or more encoding parameters further comprises a dimensionality sequence including the first dimensionality value and the second dimensionality value.

4. The method of claim 1, wherein encoding the first portion of the user information during the first TCM processing interval comprises:
processing the first portion of the user information with a convolutional encoder.

5. The method of claim 4, further comprising:
partitioning a multi-dimensional signal constellation into a plurality of cosets;
selecting one of the plurality of cosets based on an output of the convolutional encoder; and
modulating the user information according to the selected one of the plurality of cosets.

6. The method of claim 4, wherein:
the one or more encoding parameters further comprises a puncturing matrix; and
the convolutional encoder employs code puncturing according to the puncturing matrix.

7. The method of claim 4, wherein:
the convolutional encoder employs code shortening and/or code puncturing; and
one or more parameters of the code shortening and/or code puncturing are updated at each of a plurality of times in response to a corresponding change in a dimensionality value associated with a TCM symbol.

8. The method of claim 1, wherein the target information rate for the encoded TCM data is updated after encoding a predetermined number of TCM symbols.

9. The method of claim 8, further comprising updating values of the one or more encoding parameters in response to the updating of the target information rate.

10. The method of claim 1, further comprising:
measuring the system output rate, and
updating the one or more encoding parameters in response to detecting a difference between the system output rate and the target information rate.

11. The method of claim 1, wherein a set of coded bits corresponding to a coset label is mapped into a channel domain representation matrix, wherein the set of coded bits is uniquely identifiable from the channel domain representation matrix.

12. The method of claim 1, wherein:
the one or more encoding parameters further comprises:
a coset number, and
a signal constellation containing V signal points; and
the V signal points are segmented into a number of cosets equal to the value of the coset number.

13. A system for generating encoded trellis coded modulation (TCM) data from user information, the system comprising:
rate control circuitry configured to determine a target information rate for the encoded TCM data;
feedback circuitry configured to select one or more encoding parameters based on the determined target information rate, the one or more encoding parameters comprising a first dimensionality value for use during a first TCM processing interval and a second dimensionality value for use during a second TCM processing interval that occurs after the first TCM processing interval, wherein the first dimensionality value is different from the second dimensionality value; and
encoding circuitry configured to:
encode a first number x1 of bits in a first portion of user information during the first TCM processing interval based, at least in part, on the first dimensionality value to produce a first number y1 of coded bits at a first rate x1/y1,
encode a second number x2 of bits in a second portion of the user information during the second TCM processing interval based, at least in part, on the second dimensionality value to produce a second number y2 of coded bits at a second rate x2/y2, and
produce the encoded TCM data at a system output rate that is based on (x1+x2)/(y1+y2), wherein the system output rate is substantially equal to the target information rate.

14. The system of claim 13, wherein the first number of coded bits is equal to the first dimensionality value times a representation bit-length of a signal constellation, and wherein the second number of coded bits is equal to the second dimensionality value times the representation bit-length of the signal constellation.

15. The system of claim 13, wherein the one or more encoding parameters further comprises a dimensionality sequence including the first dimensionality value and the second dimensionality value.

16. The system of claim 13, wherein the encoding circuitry is further configured to encode the first portion of the user information during the first TCM processing interval by processing the first portion of the user information with a convolutional encoder.

17. The system of claim 16, wherein the encoding circuitry is further configured to:
partition a multi-dimensional signal constellation into a plurality of cosets;
select one of the plurality of cosets based on an output of the convolutional encoder; and
modulate the user information according to the selected one of the plurality of cosets.

18. The system of claim 16, wherein the convolutional encoder employs code shortening and/or code puncturing; and
one or more parameters of the code shortening and/or code puncturing are updated at each of a plurality of times in response to a corresponding change in a dimensionality value associated with a TCM symbol.

19. The system of claim 13, wherein the rate control circuitry is further configured to update the target information rate for the encoded TCM data after the encoding circuitry encodes a predetermined number of TCM symbols.

20. The system of claim 19, wherein the feedback circuitry is further configured to update values of the one or more encoding parameters in response to the updating of the target information rate.

\* \* \* \* \*